United States Patent
Leu

(10) Patent No.: US 8,607,169 B2
(45) Date of Patent: Dec. 10, 2013

(54) INTELLIGENT DEFECT DIAGNOSIS METHOD

(75) Inventor: Iyun Leu, Hsinchu (TW)

(73) Assignee: Elitetech Technology Co., Ltd., Hsinchu County (TW)

( * ) Notice: Subject to any disclaimer, the term of this patent is extended or adjusted under 35 U.S.C. 154(b) by 0 days.

(21) Appl. No.: 13/338,331

(22) Filed: Dec. 28, 2011

(65) Prior Publication Data
US 2013/0174102 A1 Jul. 4, 2013

(51) Int. Cl.
*G06F 17/50* (2006.01)

(52) U.S. Cl.
USPC .............. 716/52; 716/100; 716/111; 716/112

(58) Field of Classification Search
USPC .......................................................... 716/52
See application file for complete search history.

(56) References Cited

U.S. PATENT DOCUMENTS

| 2006/0273266 A1* | 12/2006 | Preil et al. ...................... 250/548 |
| 2007/0061773 A1* | 3/2007 | Ye et al. .......................... 716/21 |
| 2010/0180239 A1 | 7/2010 | Leu |
| 2010/0215247 A1* | 8/2010 | Kitamura et al. ............. 382/149 |
| 2011/0082650 A1 | 4/2011 | Leu |
| 2012/0259574 A1* | 10/2012 | Hu et al. ........................ 702/117 |

OTHER PUBLICATIONS

Li, Xiaolei et al., "A Study of Defect Propagation/Growth for VSLI Manufacturing Yield Impact Prediction", Oct. 6-8, 1997, Semiconductor Manufacturing Conference Proceedings, 1997 IEEE International Symposium on, pp. E31-E34.*

* cited by examiner

*Primary Examiner* — Paul Dinh
*Assistant Examiner* — Bryce Aisaka
(74) *Attorney, Agent, or Firm* — Li & Cai Intellectual Property (USA) Office

(57) ABSTRACT

An intelligent defect diagnosis method for manufacturing fab is provided. The intelligent defect diagnosis method comprises: receiving pluralities of defect data, design layouts and fabrication data; analyzing the defect data, design layouts, and the fabrication data by a defect analysis system, wherein the analyzing step further contains the sub-steps: segmenting and grouping the design layouts into pluralities of multi-pattern group cells to construct LPG cell based pattern groups; introducing the defect data; segmenting defect image into pluralities of defect and pattern contours; mapping the defect data to each multi-pattern group cell to form the LPG based defect composite pattern group; performing coordinate conversion and pattern match between image contour and design layout for coordinate correction; fulfilling CAA with defect contour, pattern contour and design layout, and obtaining corresponding defect yield; classifying the defect type of defect data through defect image classification analysis.

6 Claims, 9 Drawing Sheets

INTELLIGENT DEFECT DIAGNOSIS METHOD

BACKGROUND OF THE INVENTION

1. Field of the Invention

The present invention relates to a diagnosis method, particularly to a defect diagnosis method for implementation in semiconductor fab, flat panel display fab, solar cell fab, Printed Circuit Board (PCB) mask fab or LED assembly house.

2. Description of Related Art

The sophisticated manufacturing techniques in a fabrication process for integrated circuit dice includes film deposition, masking, photo lithography, etching, etc. During the fabrication process, defects may occur as a result of factors attributed from different sources, for example, equipment malfunction, facility leak, impurities of environment, and design layout problems or the like. These defects can generally be categorized into random defects or systematic defects. Regardless of the form of defect, defects in pattern size may affect the production yield, which in turn will translate into higher cost. In a fab (i.e. manufacturing factory), "Perform defect and image pattern metrology data analysis real time in manufacturing stage" becomes a key approach to yield enhancement and core innovation in this article.

First, we can perform defect data mining with automatic defect classification, killer defect (i.e. defect of material or device layout which is a reason for the catastrophic failure of the device) yield and pattern contour metrology data of all fab SEM (scanning electron microscope) and optical images, (reference is made to patent Ser. No. 12/318,974 automatic defect yield diagnosis system by the instant Applicant), fab in-line data, and Cp (Chip probe) yield test data. Current manual defect image review operations can not provide defect data mining techniques in defect analysis because of insufficient defect analysis data. So, defect data mining using information in the fab in-line data (which may include critical dimension, thickness, lot history, equipment run history, Fault Detection and Classification/FDC data, etc.), 100% automatic defect classification and killer defect yield, Cp test binning data, and all image (SEM or optical images) pattern contour metrology data analysis system, will offer innovative and quick solution to defect yield.

Second, the integration of all process steps' defect yield prediction data and product logistic WIP (Work-in-Process) data provides fab and design house not just the wafer quantity delivery data, but also good die delivery quantities prediction real time.

Third, the cumulative frequent failure defect layout pattern analysis across lots and products can be achieved through "Layout based defect composite pattern group" method (according to previous invention "Method for Smart defect screen and sample"). Defect pattern library collects those frequent failure defect layout pattern for Design-for-manufacturing (DFM) check and yield improvement.

Last, layout, and lithography simulation (ex. Optical Proximity Correction simulation) pattern analysis with all fab image pattern contours are composite overlapped with pattern match. Pattern contour metrology data are checked against layout pattern spec to identify systematic defect pattern and process defect pattern. The defect layout pattern can be from either mapping layout pattern of corresponding defect image pattern or pre-extracted design weak layout patterns of interest in Graphic Database System (GDS) or in Open Access Same-time Information System (OASIS). Those systematic defect or process defect layout pattern are saved in defect pattern library for DFM check and yield improvement.

Consequently, because of the above consideration resulting from the technical design of prior art, the inventor strives via real world experience and academic research to develop the present invention, which can effectively improve the limitations described above.

SUMMARY OF THE INVENTION

The primary object of present invention is to monitor and debug defect yield in a fabrication process on a near real-time basis; particularly, apply defect data mining technique on automatic defect classification data and defect yield data, image metrology data with fab in-line data to debug defect yield loss or process window quickly.

Another object of present invention is to identify abnormal defect pattern through defect image pattern metrology analysis. Check metrology data of composite defect image pattern, layout pattern, and lithography simulation pattern polygons against pattern spec to identify systematic defect pattern and process defect pattern. The image pattern metrology analysis system automatically diagnoses abnormal defect pattern instead of manual analysis on sampled images with luck.

Yet another object of present invention is to integrate defect yield prediction data and Work-in-process (WIP) data to provide real-time logistic good die delivery quantity prediction. The frequent failure defect layout pattern uses layout pattern group based defect composite pattern analysis technique to find out major yield killer defect patterns in manufacturing. No one analyzes possible defect failure pattern systematically from layout pattern analysis, but from physical failure analysis on failed die or packages.

To achieve the foregoing and the other objects, an intelligent defect diagnosis method for manufacturing fab is provided. The intelligent defect diagnosis method comprises: receiving pluralities of defect data from at least one defect inspection tool, pluralities of design layouts generated from a profile design system, and pluralities of fabrication data produced in the fab; analyzing the defect data, design layouts, and the fabrication data by a defect analysis system, wherein the analyzing step further contains the following sub-steps: segmenting and grouping the design layouts into pluralities of multi-pattern group cells to construct Layout Pattern Group (LPG) cell based pattern groups; introducing the defect data; segmenting defect image into pluralities of defect and pattern contours; mapping the defect data to each multi-pattern group cell to form the LPG based defect composite pattern group; performing coordinate conversion and pattern match between image pattern contour and design layout polygon for coordinate correction; fulfilling Critical Area Analysis (CAA) with defect contour, pattern contour or design layout polygon, and obtaining corresponding defect yield; classifying the defect type of defect data through defect image classification analysis.

To achieve the foregoing and the other objects, another intelligent defect diagnosis method for manufacturing fab is provided. The intelligent defect diagnosis method comprises: receiving pluralities of defect data from at least one defect inspection tool, pluralities of design layouts generated from a profile design system, and pluralities of fabrication data produced in the fab; analyzing the defect data, design layouts, and the fabrication data by a defect analysis system; comparing the dimensions of the layout polygons and the image pattern contours of defect data; defining a tolerance on the dimension of the layout polygons; obtaining at least one hot spot if the pattern contour dimension of defect data exceed the tolerance.

According to one embodiment of the intelligent defect diagnosis method, the intelligent defect diagnosis method further comprises: defect data mining from the fabrication data, the automatic defect yield data and the automatic defect classification data.

According to one embodiment of the intelligent defect diagnosis method, the intelligent defect diagnosis method further comprises: gathering accumulative defect data of multiple lots and performing the LPG based defect composite layout pattern group; and obtaining at least one frequent failure defect layout pattern.

According to one embodiment of the intelligent defect diagnosis method, the intelligent defect diagnosis method further comprises: retrieving the fabrication data, automatic defect yield data, and the automatic defect classification data; and obtaining at least one good die quantity delivery prediction.

According to one embodiment of the intelligent defect diagnosis method, the intelligent defect diagnosis method further comprises: performing the pattern metrology analysis; and integrating all the image pattern contours and defect contours from image pattern metrology analysis into a full chip manufacturing contour pattern viewer. Users review this defect and pattern encyclopedia viewer just like a design layout viewer in fab version.

Whereby, the intelligent defect diagnosis method may have quick monitoring and rapid debugging defect yield from the fab. Besides, the defect image pattern metrology analysis is to identify systematic defect pattern and process defect pattern. Check metrology data of composite defect image pattern, layout pattern, and lithography simulation pattern polygons whether it is against pattern spec. Moreover, the defect yield prediction data and WIP data provide real-time logistic good die delivery quantity prediction. The frequent failure defect layout pattern analysis uses layout pattern group based defect composite pattern analysis technique to find out major yield killer defect patterns in manufacturing. Last, a powerful defect encyclopedia pattern viewer is built based on image pattern metrology analysis. This full chip manufacturing pattern contour viewer provides the first real manufacturing pattern viewer like a design layout viewer used in design house.

The foregoing, as well as additional objects, features and advantages of the invention will be more readily apparent from the following detailed description, which proceeds with reference to the accompanying drawings.

DETAILED DESCRIPTION OF PREFERRED EMBODIMENT

Figure 3A:
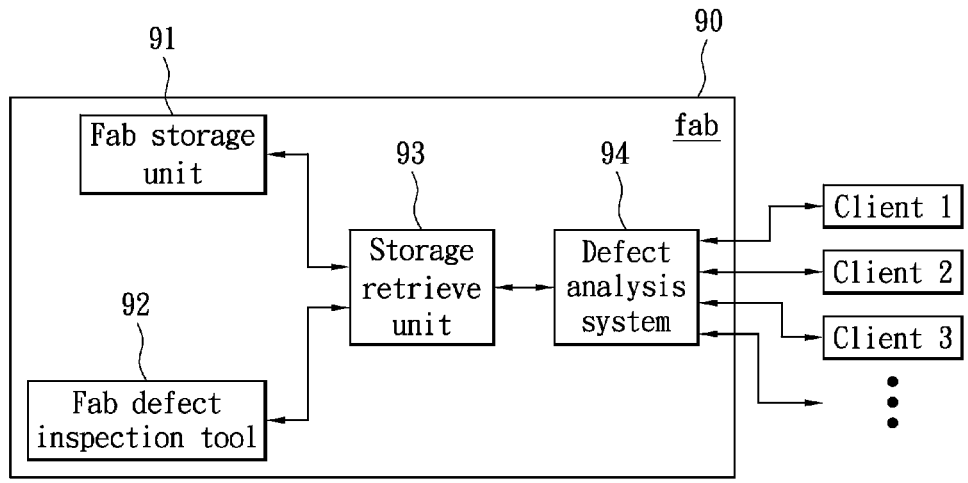
FIG. 3A is diagram showing the defect analysis system utilized in a fab.

In manufacturing industry for semiconductor, flat panel, solar cell, Light Emitted Diode (LED) or Printed Circuit Board (PCB) and Assembly mask fab, the defects generated in the manufacturing factory (hereafter referred as fab) are probed and analyzed by all kinds of effort. Those defects in electronic product may be inevitably generated due to nature of the manufacturing process technical limitation or poor control of the equipments. Please refer to FIG. 3A, several facilities such as fab storage unit 91, defect inspection tool 92, storage retrieve unit 93 and defect analysis system 94 are normally utilized in the fab 90 for the purpose of reducing physical deficiencies on the aforementioned products. The fab defect inspection tool 92 and the fab storage unit 91 which obtains and stores up the defect data are normally linked to the storage retrieve unit 93, and so as to further connect to the defect analysis system 94. After the defect data are analyzed by the defect analysis system 94, all kind of useful and powerful information regarding to the defect data may be collected and then delivered to the clients 1, 2, 3. Preferably, the defect data could be defect scan data, Scanning Electron Microscope (SEM) image, E-beam image, optical image, defect shape, defect geometry, defect information (i.e. dimension, width, size, coordinate and/or space, etc.), defect contour, spot location or spot size. Those defect data could be obtained from the fab defect inspection tool 92 such as microscopic device, SEM, e-beam inspection tool, optical inspection tool, Review SEM, defect scan tool or camera.

Before the electronic products are manufactured, at least one design layout is needed to be produced, in which the design layout could be layout polygon, layout shape, layout geometry, layout dimension, layout contour, layout coordinate, layers and text labels or layout size; wherein those design layouts may be of Graphic Database System (GDS) format, GDS-II format, or Open Access Same-time Information System (OASIS) format generated from a profile design system/database such as lithography simulation or Computer Aided Design (CAD) device. Conventionally, these GDS format (or GDS-II format) based design layout for semiconductor or Integrated Circuit (IC) are normally created by various CAD programs for using as a standard inter-changeable format between these IC design applications. When semiconductor devices shrink in size greatly, this leads to possible systematic pattern defects due to limitations in the manufacturing process. So, new method like frequent failure defect pattern analysis and full chip manufacturing contour pattern viewer provides defect yield solution that traditional defect analysis way can not achieve.

Below, an intelligent defect diagnosis method of present invention for manufacturing fab is disclosed. The intelligent defect diagnosis method utilizes pluralities of image pattern data, metrology data (such as pattern contour or layout polygon) and in-line fabrication data, which may provide effective and near real-time wafer defect analysis. Moreover, the intelligent defect diagnosis method is capable of debugging defect yield through data mining techniques, detecting cumulative frequent failure defect layout pattern, detecting systematic and process defect image pattern, and predicting good die quantity delivery on the article during fabrication process. In words, the clients 1, 2, 3 can manage defect yield with most efficiency and minimum time in the fab 90.

Figure 1A:
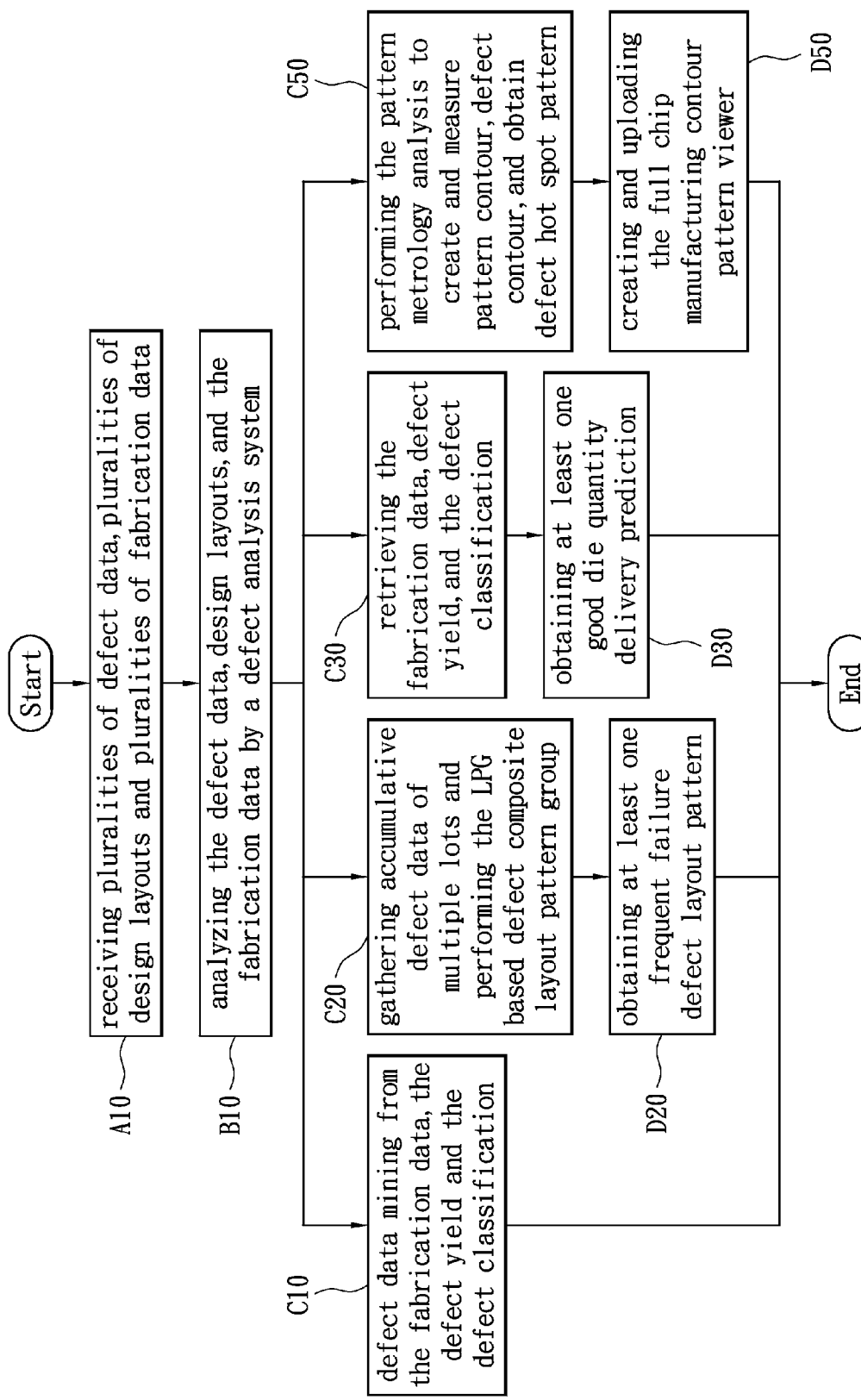
FIG. 1A is flow chart of the intelligent defect diagnosis method according to the $1^{st}$ embodiment of the present invention.

Please refer to FIG. 1A, The intelligent defect diagnosis method utilized within the manufacturing fab 90 comprises the following steps: first, receiving pluralities of defect data from at least one defect inspection tool 92, pluralities of design layouts generated from a profile design system, and pluralities of fabrication data produced in the fab 90 (Step A10). The fabrication data may be WIP (Work-in-process) data or in-line data obtained from the fab MES (Manufacturing Execution System) or data collection system located in the fab (i.e. wafer manufacturing factory); wherein the fabrication data may contain basic manufacturing information such as product data, manufacturing status, etc., in each of specific wafer.

Figure 1B:
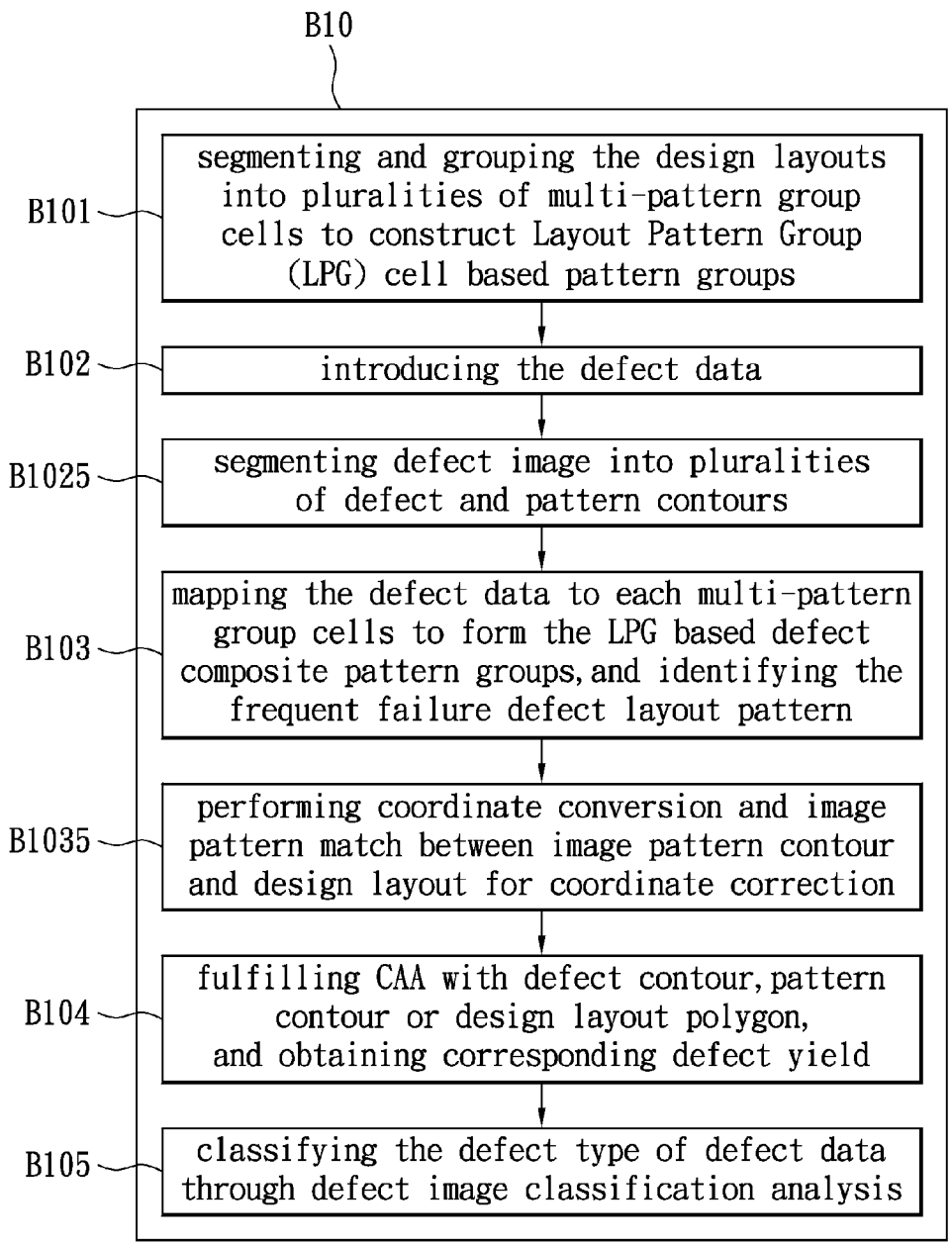
FIG. 1B is sub-steps of analyzing step B10 according to the $1^{st}$ embodiment of the present invention.

Afterward, the analysis of the defect data, design layouts, and the fabrication data by a defect analysis system (Step B10) is progressed. As for the detailed sub-steps of the analyzing Step B10 as shown in FIG. 1B, the Step B10 may further comprises: segmenting and grouping the design layouts into a plurality of multi-pattern group cells to construct Layout Pattern Group (LPG) cell based pattern groups (Step B101); introducing the defect data (Step B102); segmenting defect image into pluralities of defect and pattern contours (Step B1025); mapping the defect data to each multi-pattern group cells to form the LPG based defect composite pattern groups, and identifying the frequent failure defect layout pattern (Step B103); performing coordinate conversion and pattern match between image pattern contour and design layout for coordinate correction (Step B1035); fulfilling Critical Area Analysis (CAA) with defect contour, pattern contour or design layout polygon, and obtaining corresponding defect yield (Step B104); and then classifying the defect type of defect data through defect image classification analysis (Step B105).

Figure 1C:
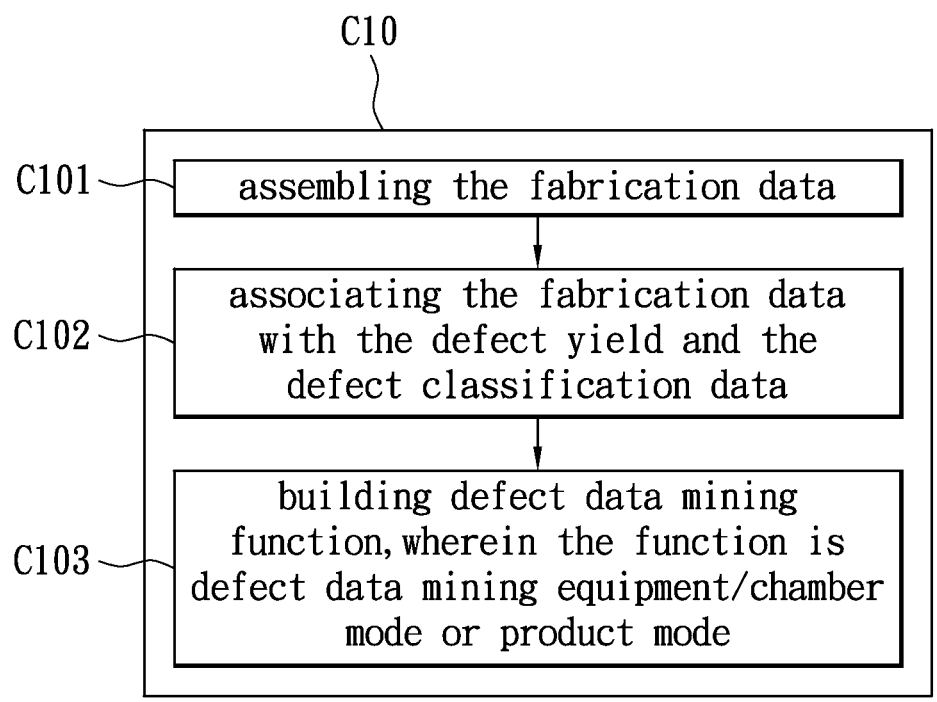
FIG. 1C is sub-steps of defect data-mining step C10 according to the $1^{st}$ embodiment of the present invention.

Then, Step C10 performs defect data-mining process on the fabrication data, the automatic defect yield data and the automatic defect classification data. For more detail, please refer to FIG. 1C, which shows the sub-steps of defect data mining step C10 according to the $1^{st}$ embodiment of the present invention. Step C10 may further comprise the following sub-steps: assembling the fabrication data (Step C101); associating the fabrication data with the 100% automatic defect yield data and the 100% automatic defect classification data (Step C102); and then building defect data-mining function, wherein the defect data mining function is equipment/chamber mode, product mode, fab in-line data mode, Fault Detection and Classification (FDC) mode, or golden path mode defect data mining (Step C103). The goal of associating defect data mining is to find defect failure root cause during real time manufacturing stage while Cp yield data mining and device test data mining functions can not achieve until wafer out of fab. This yield solution saves potential yield loss and solve problem a few weeks or months earlier. For example, the defect data mining includes the following functions. Equipment and chamber mode defect data mining uses commonality statistical analysis to search for a specific mal-functioned equipment. Product mode defect data mining uses commonality statistical analysis and frequent failure defect pattern analysis to search for a specific product that has sensitive defect failure layout pattern. Fab in-line data mining is to use SPC and statistical analysis to find out the optimal process in-line data window for good defect yield. FDC mode defect data mining is to use statistical analysis to find out sensitive FDC parameter to defect yield and commonality analysis to search specific abnormal FDC parameter to a defect failure. Golden path mode defect data mining uses statistical analysis to find out the best equipment combination groups that produce better yield.

Except for Step C10, the Step C20 and Step D20 may also be implemented (FIG. 1A); in which the following steps are introduced: gathering accumulative defect data of multiple lots and performing the LPG based defect composite layout pattern group (Step C20); and obtaining at least one frequent failure defect layout pattern (Step D20). In these steps, some frequent failure defect layout pattern of each product can be extracted from plurality lots; then, the weak defect layout patterns across different product design layouts are further screened with defect layout pattern match between products. In this manner, high appearance of failure defect layout pattern across lots or products are categorized into defect pattern library, hence the frequent failure defect layout pattern of each layer is critical for yield improvement.

Next, the Step C30 and Step D30 may also be implemented; in which the following steps are introduced: retrieving the fabrication data, automatic defect yield, and the automatic defect classification (Step C30); and obtaining at least one good die quantity prediction (Step D30). As for these steps, new information not only includes production lot quantity and process stage data, but also contains composite defect yield loss analysis data from cumulative process layer's killer defect yield analysis data. The possible good die output quantities of each production lot can be estimated at any time. The quality predicted through a specific mathematical model may generate the percentage of correct predictions for a given data set. The goal of these steps is to get a model with a high quality. The fraction of correct predictions should be as high as possible when the model is utilized to predict the outcome for entities for which the outcome is not yet known.

Figure 1D:
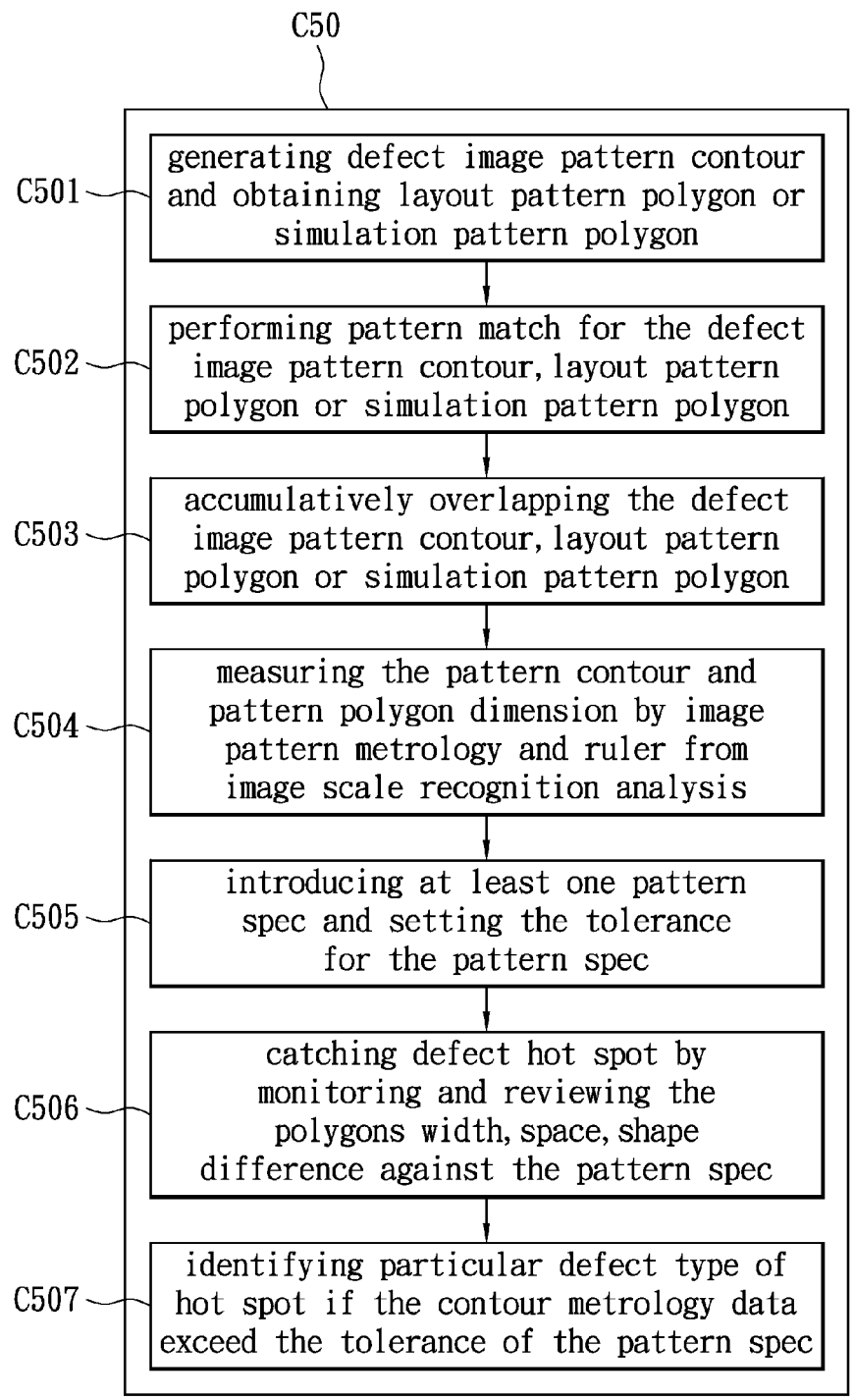
FIG. 1D is sub-steps of performing step C50 according to the $1^{st}$ embodiment of the present invention.

Afterward, the Step C50 and Step D50 may also be implemented; in which the following steps are introduced: performing the pattern metrology analysis to create and measure pattern contour, defect contour, and catch defect hot spot pattern (Step C50); and integrating and uploading all the image pattern contours and defect contours from image pattern metrology analysis into a full chip frame. Creating a full chip manufacturing contour pattern viewer as a defect and pattern encyclopedia viewer just like a design layout viewer (Step D50). In order to fulfill the pattern metrology analysis, the performing step of Step C50 shall further contain the following sub-steps (shown in FIG. 1D): generating defect image pattern contour and obtaining layout pattern polygon or simulation pattern polygon (Step C501); performing pattern match for the defect image pattern contour, layout pattern polygon or simulation pattern polygon (Step C502); accumulatively overlapping the defect image pattern contour, layout pattern polygon or simulation pattern polygon (Step C503); measuring the image pattern contour and layout pattern polygon dimension by image pattern metrology and scale ruler from image scale recognition analysis (Step C504), i.e. getting image scale from optical character recognition of 'field of view scale', 'scale bar scale', and image file size scale; introducing at least one pattern spec and setting the tolerance for the pattern spec (Step C505); catching defect hot spot pattern by checking the polygons width, space, shape difference against the pattern spec (Step C506); identifying particular defect hot spot pattern if the contour metrology data exceed the tolerance of the pattern spec (Step C507).

Figure 4:
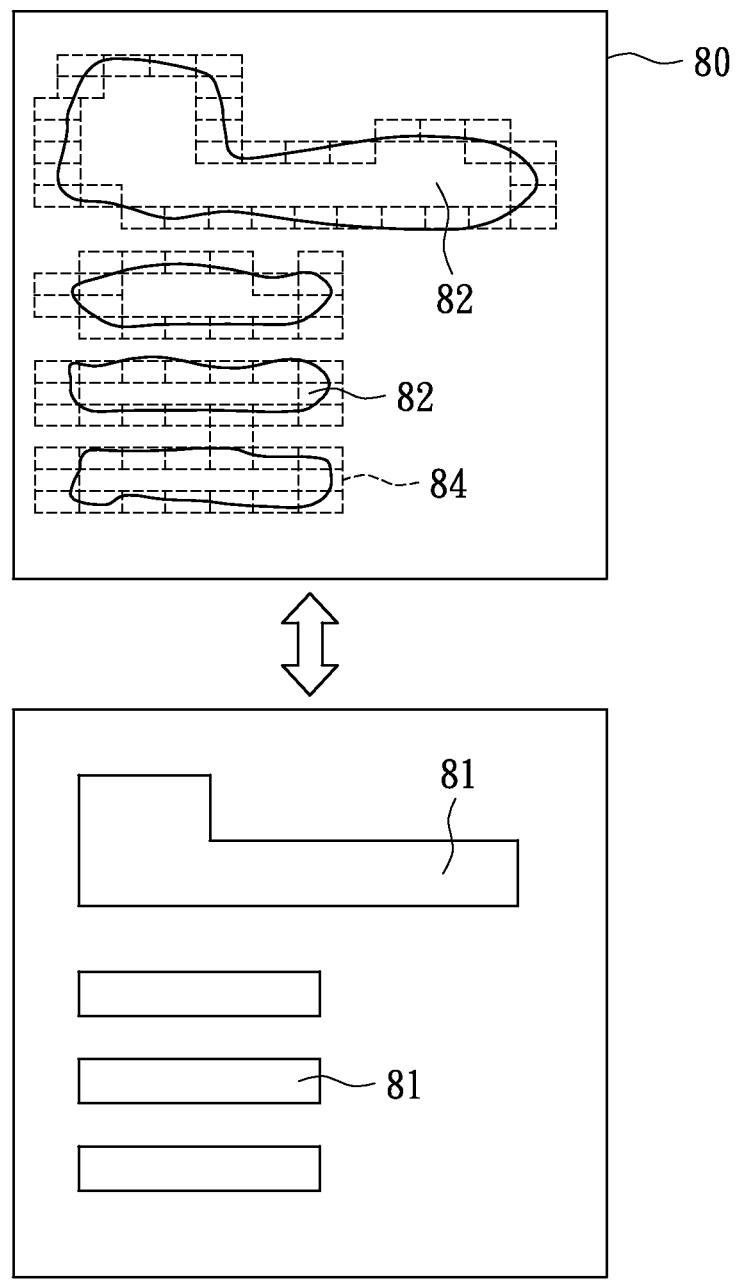
FIG. 4 is schematic diagram of the metrology analysis performing Step C50.

In this manner, at least one image pattern contour 82 is revealed in the wafer 80 (as shown in FIG. 4), in which the image pattern contour 82 is broken down into pluralities of the pattern polygons 84. On the other hand, pluralities of ideal layout patterns 81 are generated or simulated from previous profile design system/database. Afterward the pattern match for the layout patterns 81 and the image pattern contours are preceded (Step C502). The pluralities of the defect image pattern contours, layout polygons and simulation pattern polygons are accumulatively overlapped (Step C503). A ruler from image scale analysis is used to measure the image pattern contour and layout pattern polygon dimension. A user defines pattern spec tolerance (Step C505). After matching, the hot spot which exceeds the predetermined tolerance may be found by means of differentiating the polygons and contours width, space, shape difference against the pattern spec (Step C506~C507). As a result, the hot spot pattern, a common seen deficiency in wafer, is easily found.

Figure 1E:
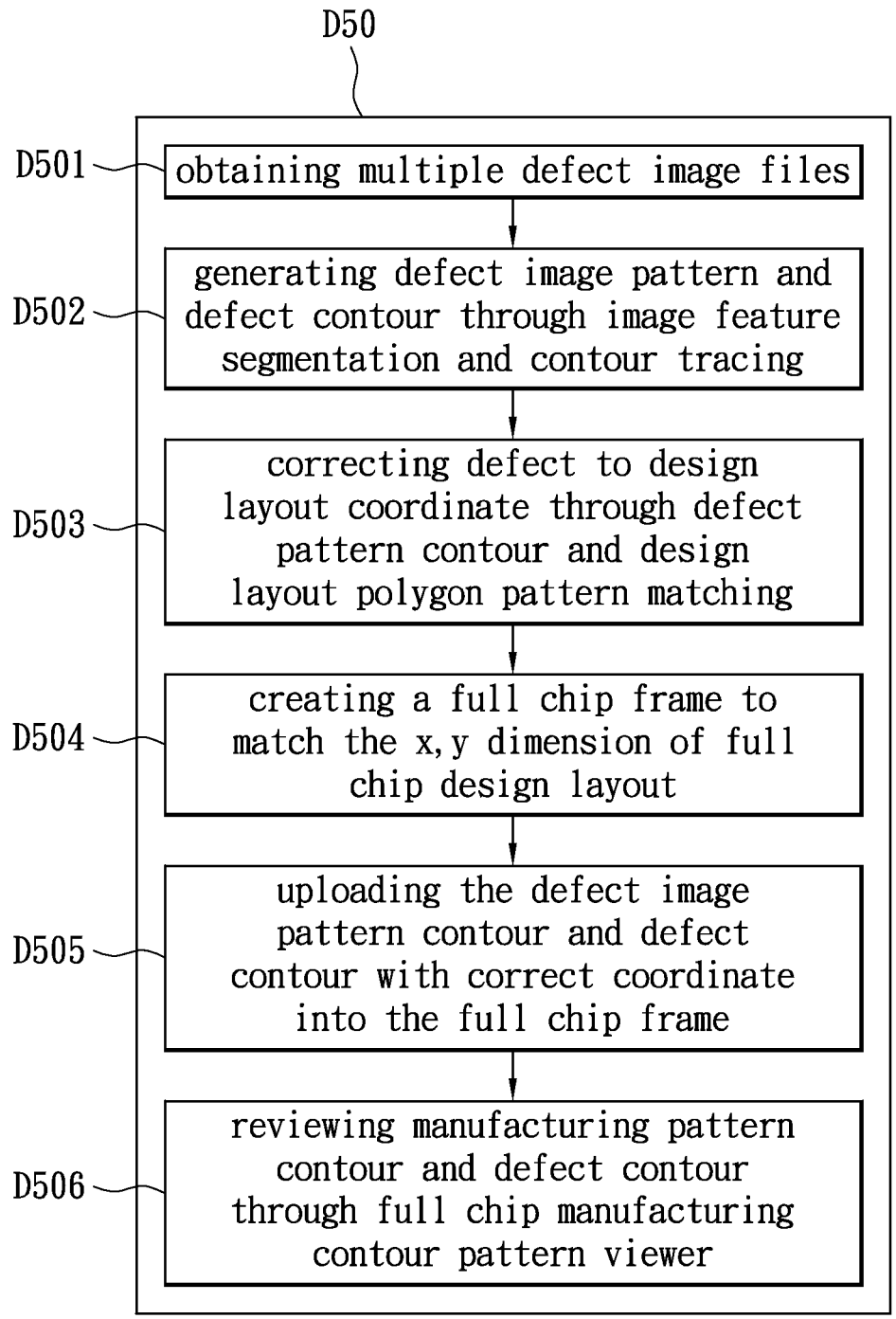
FIG. 1E is sub-steps of creating and uploading step D50 according to the $1^{st}$ embodiment of the present invention.
Figure 1F:
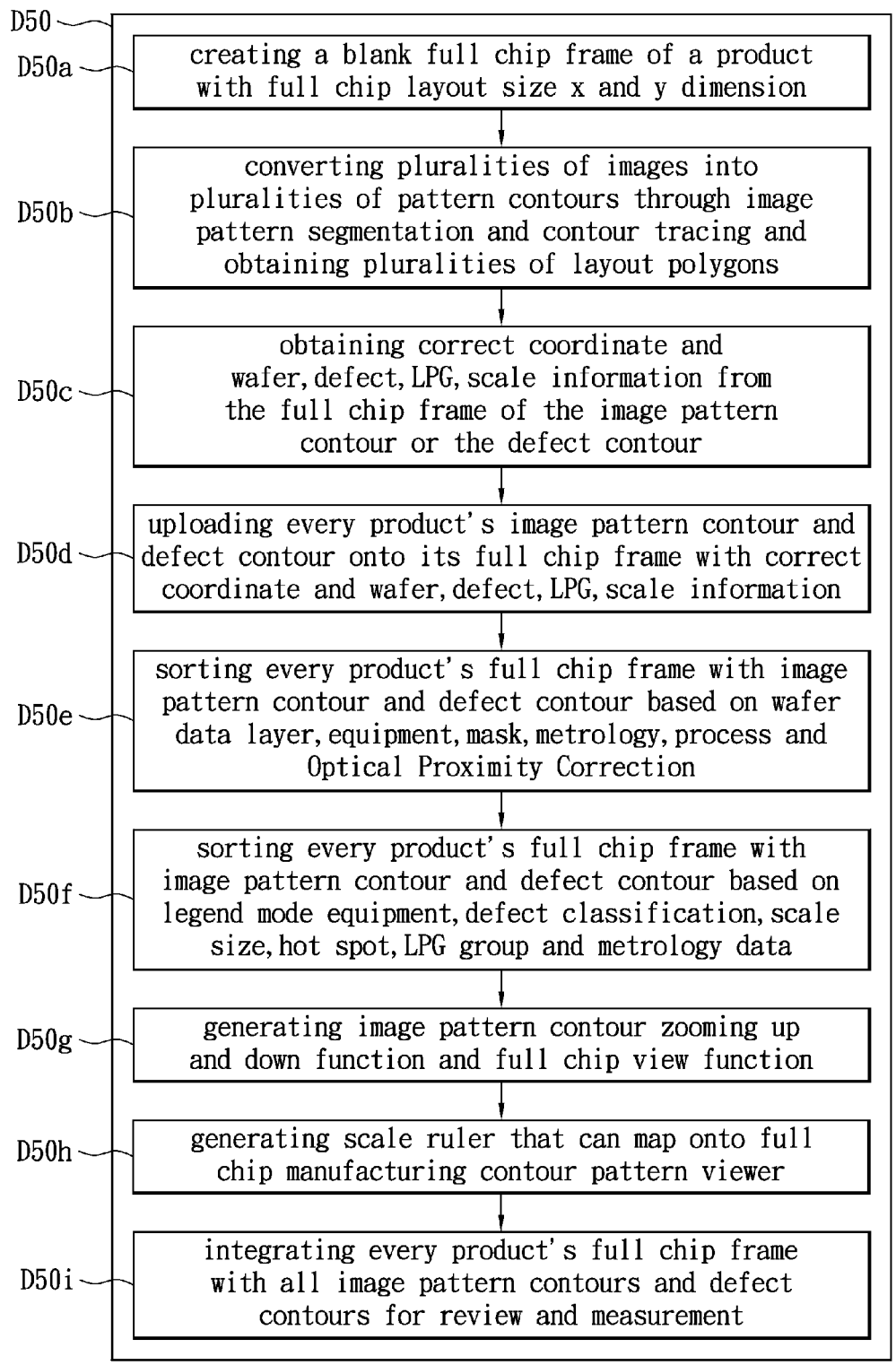
FIG. 1F is another sub-steps of creating and uploading step D50 according to the $1^{st}$ embodiment of the present invention.

Please refer to FIG. 1E, the contour pattern viewer creating and uploading step (Step D50) may further comprises the following sub-steps: obtaining plurality defect image files (Step D501); generating defect image pattern contour and defect contour through image feature segmentation and contour tracing (Step D502); correcting defect to design layout coordinate through defect image pattern contour and design layout polygon pattern matching (Step D503); creating a full chip frame to match the x, y dimension of full chip design layout (Step D504); uploading the defect image pattern contour and defect contour with correct coordinate into the full chip frame (Step D505); reviewing manufacturing pattern contour and defect contour through full chip manufacturing contour pattern viewer (Step D506).

In this manner, the analyzed results from Step C50 are further utilized in Step D50, so that full chip frame matching or correcting with x-y coordinate are integrated (Step D503~D504), in which the image pattern metrology can be pixel scale and pixel value. Afterward, uploading the matching data so as to allow the client 1, 2, 3 to review or monitor. In preferable embodiment, the full chip manufacturing contour pattern viewer may be cumulative pattern viewer, defect contour viewer. So that all defect images pattern contour and defect contour may be hence integrated.

In another embodiment, the contour pattern viewer creating and uploading step (Step D50) may further comprise the following sub-steps: creating a blank full chip frame of a product with full chip layout size x and y dimension (Step D50a); converting pluralities of images into pluralities of pattern contours through image pattern segmentation and contour tracing and obtaining pluralities of layout polygons; performing pattern match for the defect image pattern contour, layout pattern polygon or simulation pattern polygon (Step D50b); obtaining correct coordinate and wafer, defect, LPG, scale information from the full chip frame of the image pattern contour or the defect contour (Step D50c); uploading every product's image pattern contour and defect contour onto its full chip frame with correct coordinate and wafer, defect, LPG, scale information (Step D50d); sorting every product's full chip frame with image pattern contour and defect contour based on wafer data layer, equipment, mask, metrology, process and Optical Proximity Correction (OPC) (Step D50e); sorting every product's full chip frame with image pattern contour and defect contour based on legend mode equipment, defect classification, scale size, hot spot, LPG group and metrology data (Step D50f); generating image pattern contour zooming up and down function and full chip view function (Step D50g); generating scale ruler from image scale recognition analysis that can map onto full chip manufacturing contour pattern viewer (Step D50h); integrating every product's full chip frame with all image pattern contours and defect contours for review and measurement (Step D50i). In this manner, similar advantages from LPG and metrology data may be accommodated for pattern viewer.

Figure 2A:
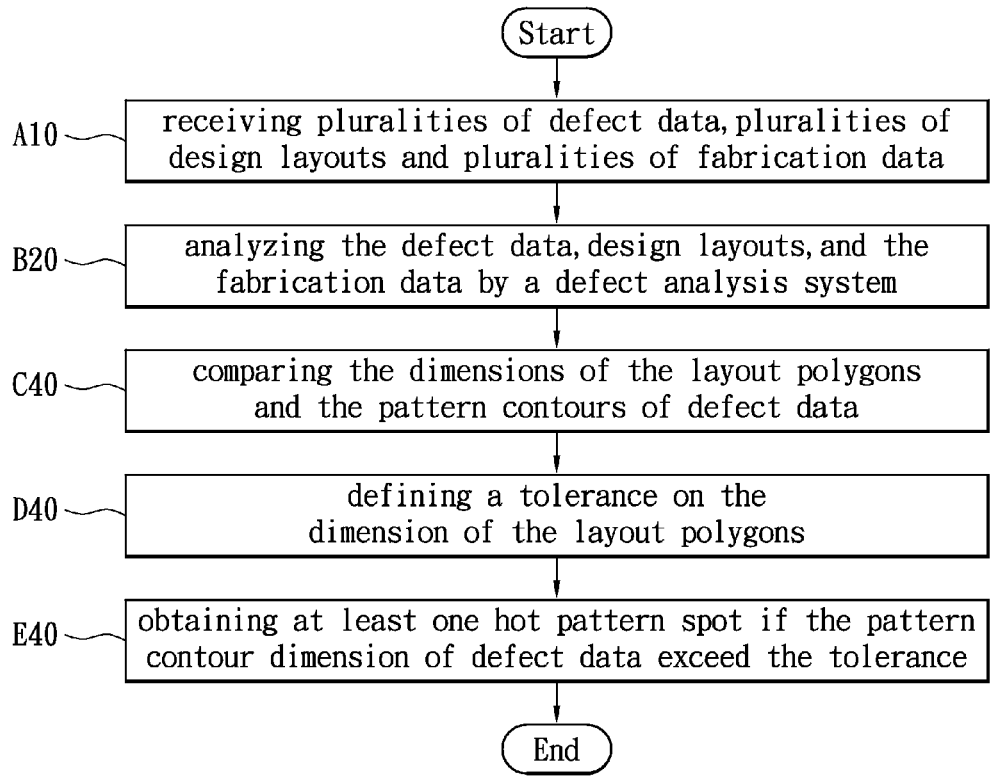
FIG. 2A is flow chart of the intelligent defect diagnosis method according to the $2^{nd}$ embodiment of the present invention.

There is still another embodiment remained. Please refer to FIG. 2A, FIG. 2A is flow chart of the intelligent defect diagnosis method according to the $2^{nd}$ embodiment of the present invention. As show in FIG. 2A, the $2^{nd}$ embodiment of the present invention comprises the following steps: receiving a plurality of defect data, a plurality of design layouts and a plurality of fabrication data (Step A10); analyzing the defect data, defect image, design layouts, and the fabrication data by a defect analysis system (Step B20); generating pattern contours of defect images; comparing the dimensions of the layout polygons and the pattern contours of defect data (Step C40); defining a tolerance on the dimension of the layout polygons (Step D40); obtaining at least one hot spot pattern if the pattern contour dimension of defect data exceed the tolerance (Step E40).

Figure 2B:
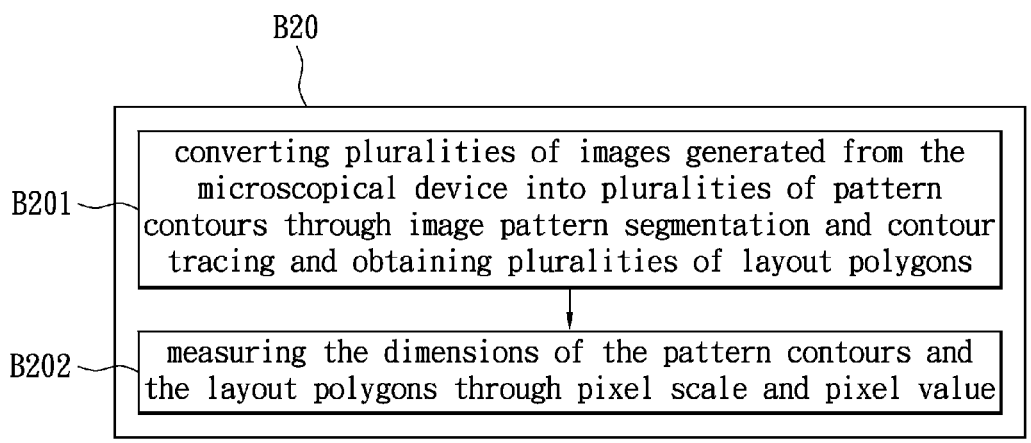
FIG. 2B is sub-steps of analyzing step B20 according to the $2^{nd}$ embodiment of the present invention.

In this embodiment, the Step A10 is identical to the $1^{st}$ embodiment as shown in FIG. 1A; however, analyzing Step B20 may comprise distinct sub-steps although it has similar analyzing step to the Step B10 as indicated in FIG. 1A. The sub-steps of the Step B20 are shown in FIG. 2B, which comprises: converting pluralities of images generated from the microscopical device into pluralities of pattern contours through image pattern segmentation and contour tracing and obtaining pluralities of layout polygons (Step B201); and measuring the dimensions of the pattern contours and the layout polygons through pixel scale and pixel value (Step B202).

After Step B20 is carried out, Steps C40, D40 and E40 are performed. The pattern contours of defect images may be shifted away from original target pattern. So, fab has to adjust process conditions to correct pattern contour in order to meet pattern spec tolerance. Otherwise, defect hot spot pattern is caught when the image pattern contour dimension exceeds pattern spec tolerance.

By carrying out these steps of the intelligent defect diagnosis method, quick monitoring and rapid debugging defect yield from the fab 90 become possible. Besides, the defect image pattern metrology analysis, i.e. checking metrology data of composite defect image pattern, layout pattern, and lithography simulation pattern polygons against pattern spec, are easily achieved. So that identifying systematic defect pattern and processing defect pattern is convenient. Moreover, the defect yield prediction data and WIP data provide real-time logistic good die delivery quantity prediction. The frequent failure defect layout pattern with LPG based defect composite pattern group method also detects any common yield killer defect patterns in manufacturing.

Figure 3B:
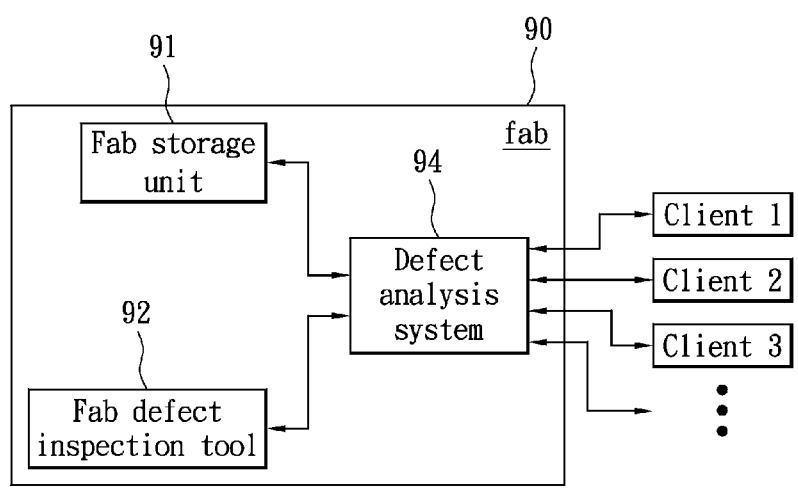
FIG. 3B is another diagram showing the defect analysis system utilized in a fab.

In another embodiment of fab 90 as shown in FIG. 3B, the fab storage unit 91 and the fab defect inspection tool 92 may directly input the manufacturing data into the defect analysis system 94, so as to accommodate the clients 1, 2, 3 for utilizing or monitoring.

While certain exemplary embodiments have been described and shown in the accompanying drawings, it is to be understood that such embodiments are merely illustrative of and not restrictive on the broad invention, and that this invention is not be limited to the specific constructions and arrangements shown and described, since various other modifications may occur to those ordinarily skilled in the art.

What is claimed is:

1. An intelligent defect diagnosis method for manufacturing fab, comprising:
   receiving, by a processor, pluralities of defect data from at least one defect inspection tool, pluralities of design layouts generated from a profile design system, and pluralities of fabrication data produced in the fab;

analyzing, by a processor, the defect data, design layouts, and the fabrication data, wherein the analyzing step further contains the following sub-steps:
  segmenting and grouping the design layouts into pluralities of multi-pattern group cells to construct Layout Pattern Group (LPG) cell based pattern groups;
  introducing the defect data;
  segmenting defect image into pluralities of defect and pattern contours;
  mapping the defect data to each multi-pattern group cells to form the LPG based defect composite pattern groups, and identifying the frequent failure defect layout pattern;
  performing coordinate conversion and image pattern match between image pattern contour and design layout for coordinate correction;
  fulfilling Critical Area Analysis (CAA) with defect contour, pattern contour or design layout polygon, and obtaining corresponding defect yield;
  classifying the defect type of defect data through defect image classification analysis;
  performing the pattern metrology analysis to create and measure pattern contour, defect contour, and obtain defect hot spot pattern; and
  integrating image pattern contours and defect contours and creating the full chip manufacturing contour pattern viewer, wherein the contour pattern viewer creating step and uploading step further comprises the following sub-steps:
    creating a blank full chip frame of a product with full chip layout size x and y dimension;
    converting pluralities of images into pluralities of pattern contours through image pattern segmentation and contour tracing and obtaining pluralities of layout polygons;
  performing pattern match for the defect image pattern contour, layout pattern polygon or simulation pattern polygon;
    obtaining correct coordinate and wafer, defect, LPG, scale information for the full chip frame of the image pattern contour or the defect contour;
    uploading every product's image pattern contour and defect contour onto its full chip frame with correct coordinate and wafer, defect, LPG, scale information;
    sorting every product's full chip frame with image pattern contour and defect contour based on wafer data layer, equipment, mask, metrology, process and Optical Proximity Correction (OPC);
    sorting every product's full chip frame with image pattern contour and defect contour based on legend mode equipment, defect classification, scale size, hot spot, LPG group and metrology data;
    generating image pattern contour zooming up and down function and full chip view function;
    generating scale ruler that can map onto full chip manufacturing contour pattern viewer;
    integrating every product's full chip frame with all image pattern contours and defect contours for review and measurement.

2. The intelligent defect diagnosis method as claim 1, wherein the method further comprises the following step:
  defect data mining from the fabrication data, the automatic defect yield data and the automatic defect classification data.

3. The intelligent defect diagnosis method as claim 2, wherein the defect data mining step further comprises the following sub-steps:
  assembling the fabrication data;
  associating the fabrication data with the automatic defect yield data and the automatic defect classification data;
  building defect data-mining function, wherein the defect data mining function is equipment/chamber mode, product mode, fab in-line data mode, Fault Detection and Classification (FDC) mode, or golden path mode defect data mining.

4. The intelligent defect diagnosis method as claim 1, wherein the method further comprises the following step:
  gathering accumulative defect data of plurality lots and performing the LPG based defect composite layout pattern group;
  obtaining at least one frequent failure defect layout pattern.

5. The intelligent defect diagnosis method as claim 1, wherein the method further comprises the following step:
  retrieving the fabrication data, the automatic defect yield data, and the automatic defect classification data;
  obtaining at least one good die quantity delivery prediction.

6. The intelligent defect diagnosis method as claim 1, wherein the pattern metrology analysis performing step further comprises the following sub-steps:
  generating defect image pattern contour and obtaining layout pattern polygon or simulation pattern polygon;
  performing pattern match for the defect image pattern contour, layout pattern polygon or simulation pattern polygon;
  overlapping the defect image pattern contour, layout pattern polygon or simulation pattern polygon;
  measuring the pattern contour and pattern polygon dimension by image pattern metrology and ruler from image scale recognition analysis;
  introducing at least one pattern spec and setting the tolerance for the pattern spec;
  catching defect hot spot pattern by checking the polygons width, space, shape difference against the pattern spec;
  identifying particular defect hot spot pattern if the contour metrology data exceed the tolerance of the pattern spec.

* * * * *